United States Patent [19]

Tani et al.

[11] Patent Number: 4,558,510

[45] Date of Patent: Dec. 17, 1985

[54] METHOD OF PRODUCING A SEMICONDUCTOR DEVICE

[75] Inventors: Keizo Tani; Masahiro Ogasawara, both of Hyogo, Japan

[73] Assignee: Tokyo Shibaura Denki Kabushiki Kaisha, Kawasaki, Japan

[21] Appl. No.: 592,596

[22] Filed: Mar. 23, 1984

[30] Foreign Application Priority Data

Mar. 31, 1983 [JP] Japan ............................ 58-55984

[51] Int. Cl.$^4$ .................... H05K 5/06; H01L 23/30
[52] U.S. Cl. ............................... 29/588; 357/72; 357/80; 264/272.17
[58] Field of Search ............... 29/588; 357/72, 80; 264/272.17

[56] References Cited

U.S. PATENT DOCUMENTS

| | | |
|---|---|---|
| 3,824,328 | 7/1974 | Ting et al. ............ 357/72 |
| 3,839,660 | 10/1974 | Stryker ............... 357/72 |
| 4,092,487 | 5/1978 | Imai .................. 357/72 |
| 4,163,072 | 7/1979 | Soos .................. 357/72 |

FOREIGN PATENT DOCUMENTS

| | | |
|---|---|---|
| 91150 | 7/1980 | Japan ................. 357/72 |
| 128755 | 8/1983 | Japan ................. 357/72 |

OTHER PUBLICATIONS

Chellis et al., "Epoxy Resin for Dielectric Layers", IBM Tech. Discl. Bull., vol. 12, No. 9, Feb. 1970.

*Primary Examiner*—Brian E. Hearn
*Assistant Examiner*—Hunter L. Auyang
*Attorney, Agent, or Firm*—Finnegan, Henderson, Farabow, Garrett & Dunner

[57] ABSTRACT

There is provided a method of producing a semiconductor device comprising a protecting silicone gel layer which covers a semiconductor chip and bonding wires for taking electrodes out of this chip, and a resin layer which has a smaller thermal expansion coefficient than that of this silicone gel layer at least part of which contacts the silicone gel layer. This method comprises the steps of: thermally expanding the silicone gel layer until it reaches the product environmental guarantee temperature which comes before the cure acceleration reaction in the resin layer; and completely curing the resin layer while maintaining the volume of the silicone gel layer at the same time, thereby fixedly adhering it with the other parts.

8 Claims, 5 Drawing Figures

METHOD OF PRODUCING A SEMICONDUCTOR DEVICE

BACKGROUND OF THE INVENTION

The present invention relates to a method of producing a semiconductor device in which a semiconductor chip and bonding wires for taking out electrodes from this semiconductor chip are covered by a silicone gel layer where this silicone gel layer is sealed by a resin from the outside ambience, and, more particularly, to a method of producing a semiconductor module for electric power in which the main circuit of a power converting section is integrated as an individual changeable part.

A conventional producing method of this kind will be described with respect to an example in the case where it is applied to a transistor of the resin sealing type with an insulative radiant plate having a simple structure. FIG. 1 illustrates a cross-sectional view of such a resin sealing type transistor.

(1) Firstly, a structure made of a ceramic substrate 11 is formed. Three independent copper plates 1a, 1b and 1c serving respectively as a collector, an emitter and the base electrodes of the transistor are directly adhered to one surface of this ceramic substrate 11, while a copper plate 1d to which other parts are soldered is directly coupled to the other surface.

(2) Secondly, a transistor chip 13 is mounted by a solder 12 on the copper plate 1a serving as the collector electrode. The other two copper plates 1b and 1c are connected to the respective emitter and base electrodes of the transistor chip 13 by bonding wires $14_1$ and $14_2$ made of, for example, aluminum (Al).

(3) Then, in the above structure, a base 15 made of copper on which a solder paste having a lower melting point than the solder 12 has been coated, and terminals 16, 17 and 18 for taking out electrodes are set in position so as to satisfy a predetermined arrangement.

(4) Next, each of the above-mentioned components disposed in the predetermined positions is put into a reflow furnace which has been set at a temperature low enough that the solder 12 does not melt. In this way, the terminals 16, 17 and 18 for taking out electrodes and the copper plates 1a, 1b and 1c on one surface on the ceramic substrate 11 are respectively mutually adhered by a solder 19. Also, the copper plate 1d on the other surface on the ceramic substrate 11 and the copper base 15 are mutually adhered by the solder 19.

(5) Then, after the flux containing the solder paste is removed, a cylindrical casing 21 made of resin on the bottom portion of which an adhesive agent 20 has been coated is mounted on the copper base 15, thereby adhering to the copper base 15. This cylindrical resin casing 21 is disposed so as to surround the ceramic substrate 11, the copper plates 1a to 1c attached on the upper portions thereof, and the terminals 16, 17 and 18.

(6) Subsequently, silicone gel from which foam has been almost completely removed is injected from the upper opening of the resin casing 21 into the casing 21 in such a manner that the silicone gel does not come into contact with the terminals 16, 17 and 18, thereby forming a silicone gel layer 22. A sufficient quantity of silicone gel is injected into the casing 21 so as to at least completely embed the bonding wires 14. After the injection, the above-mentioned structure is put in the oven which has been pre-set to 150° C. for one hour or more in order to cure the silicone gel 22. Either a single-liquid or double-liquid layer may be used as the silicone gel layer 22.

(7) Next, epoxy resin, which has been preheated to temperatures of about 70° to 80° C. to seal the silicone gel layer 22 from the outside ambience is injected into the cylindrical casing 21 of the semimanufactured product which was left at an ordinary temperature through its upper opening. Thus, an epoxy resin layer 23 is formed on the silicone gel layer 22. The quantity of the epoxy resin used may be generous, but it must not overflow from the upper opening of the resin casing 21.

(8) Then, in order to completely harden the epoxy resin layer 23, the semimanufactured product in which the epoxy resin layer 23 has been formed is put in an oven pre-set at 150° C. and cured for at least eight hours. As described above, the manufacture of a transistor such as shown in FIG. 1 is completed.

In step (7), the epoxy resin was injected after it was preheated to a temperature of about 70° to 80° C. The reason for this will now be described with reference to FIG. 2. FIG. 2 shows the characteristic curve which represents the relation between the temperature of the double-liquid thermosetting type epoxy resin and its viscosity.

As is obvious from FIG. 2, the viscosity of the epoxy resin remarkably changes depending upon the ambient temperature. At temperatures below temperature b (about 100° C.) where the cure acceleration reaction occurs, the viscosity gradually decreases as the temperature approaches b. The viscosity becomes minimal at temperature b. At temperatures over b, the cure rapidly advances, and the viscosity increases towards infinity. In FIG. 2, $T_0$ indicates an ordinary temperature. Since epoxy resin shows such a temperature-viscosity characteristic as shown in FIG. 2, it is injected into the product which has been left at an ordinary temperature while the epoxy resin is kept below "b" (for example, a temperature of "a" (about 70° to 80° C.) in FIG. 2). At temperature "b", the resin has a stable viscosity and does not harden for a long time.

On the other hand, in order to check the reliability of the resin sealing type transistor manufactured by the conventional method as described above, we performed temperature cycle tests at −40° C. to +125° C. in a product guarantee temperature range in accordance with the actual installation environment. As a result, the solders 19 for adhering the terminals 16, 17 and 18 and the copper plates 1a, 1b and 1c on the ceramic substrate 11 cracked, and separated from each other. Remarkably, we found that the adhesive between the resin casing 21 and the copper base 15 peeled off, so that they too could have separated. In addition, in the case where the thickness "h" of the epoxy resin layer 23 is small, there were cases such that the silicone gel overflowed from the gaps between the terminals 16, 17 and 18 and the epoxy resin layer 23, and between the resin casing 21 and the epoxy resin layer 23. The inventors of the present application have studied the causes of this phenomenon and have found that it occured due to a difference in the temperature change hysteresis between the epoxy resin layer 23 and the silicone gel layer 22. In other words, it has been confirmed that although a product at an ordinary temperature is put into an oven heated at about 150° C. as in step (8) as described before in order to completely cure the epoxy resin layer 23, there is for a short time a large temperature change hysteresis difference between the epoxy resin layer 23 and the silicone gel layer 22. The difference in temperature causes the above-mentioned cracks and peeling to occur. In general, 3 to 4 minutes after the resin temperature has passed about 100° C. (temperature at point "b" in FIG. 2) where the cure acceleration reaction starts, the epoxy resin 23 is about 80% cured. Thus, the epoxy resin 23 is firmly adhered to the resin casing 21 and to terminals 16, 17 and 18. However at this time, the silicone gel layer 22 reaches a temperature of up to about 70° C. At temperatures below this, the thermal expansion coefficients of the other parts, i.e., the ceramic substrate 11, copper plates 1a, 1b and 1c, terminals 16, 17 and 18, etc. are all less than ½ of the silicone gel layer 22, so that the increase in volume due to thermal expansion of those other parts is not so large. Therefore, as described above, if temperature cycle tests at −40° C. to +125° C. in the product guarantee temperature range are performed, a large internal pressure will not be caused in the silicone gel layer 22 at temperatures of less than 70° C. However, an extremely large internal pressure can happen in accordance with the rule of "pressure×volume=constant" at temperatures over 70° C. Due to this, tensile stress is applied to the solders 19 by which the terminals 16, 17 and 18 which are weak with respect to structure and the copper plates 1b, 1a and 1c are coupled. This tensile stress is repeatedly applied in the actual installation environment, so that the solders 19 crack and the parts separate due to the peeling of the solders. Furthermore, the adhesive of the resin casing 21 is peeled off, causing the resin casing 21 and the copper base 15 to be separated.

In addition, in a semiconductor device with such a constitution, the exothermic temperature range of the semiconductor chip 13 due to the on-off operation of the transistor is between about 25° C. and 150° C. Due to this, it is apparent that even by this on-off operation, the separation and the like of the parts adhered by the solders 19 or adhesive 20 occurred due to the cracks of the solders 19, the peeling of the adhesive 20, etc.

On the other hand, assuming that the parts and materials which are directly related to the occurrence of cracks in the solders are as shown in the following TABLE I, the elongation amounts of the structure as shown in the following items (A) to (C) due to the thermal expansion in the longitudinal directions of the terminals 16, 17 and 18 were calculated with regard to the temperature difference between 25° C. and 125° C., i.e., the temperature difference of 100° C. Thus, the following results were obtained. That is to say:

(A) solders + terminals for taking out electrodes (the lower surface of the solders 19 for the terminals 16, 17 and 18 are used as references)

$23.06 \times 10^{-3}$ mm (B) casing + adhesive $36.45 \times 10^{-3}$ mm (C) silicone gel + epoxy resin $62.00 \times 10^{-3}$ mm The differences between the elongation amounts due to the thermal expansion which causes the occurrence of cracks in the solders are:

$(B)-(A)=13.39 \times 10^{-3}$ mm $(C)-(A)=38.94 \times 10^{-3}$ mm

Therefore, even when taking into consideration the amount of mechanical elongation of 23% of solder, if the parts mutually coupled by the solder exhibit an amount of elongation due to thermal expansion which is greater than $(A)+0.1 \times 0.23 \approx 46 \times 10^{-3}$ mm, the solder will crack. The above calculation results represent the elongation amounts for the entire lengths of the structures of (A), (B) and (C), respectively.

Next, the thermal expansion elongation amounts of the structures shown in the following items (A)′, (B)′ and (C)′ (each corresponding to only the portion which is located in the silicone gel layer 22 having a thickness of 5 mm) were calculated; however in this case, the regions fixedly adhered by the sealing epoxy resin layer 23 were ignored. Thus, the following results were obtained at the temperature difference of 100° C.:

(A)′ solders + terminals for taking out electrodes $11.94 \times 10^{-3}$ mm (B)′ casing + adhesive $18.3 \times 10^{-3}$ mm (C)′ silicone gel $37.5 \times 10^{-3}$ mm The difference (C)′−(A)′ is $(C)'-(A)'=25.56 \times 10^{-3}$ mm;

It will be appreciated that this difference causes the solders to crack even if the mechanical elongation of 23% is considered.

TABLE I

| Parts & Materials | Material | Coefficient of Thermal Expansion | Length According to Conventional Example (mm) |
|---|---|---|---|
| Silicone gel layer 22 | Silicone | $75 \times 10^{-6}$ | 5 |
| Terminals for taking out electrodes 16, 17, 18 | Copper | $19 \times 10^{-6}$ | 12 |
| Epoxy resin layer 23 | Epoxy | $35 \times 10^{-6}$ | 7 |
| Resin casing 21 | PBT | $30 \times 10^{-6}$ | 12 |
| Solders 19 | 37 pb −63 Sn | $26.3 \times 10^{-6}$ | 0.1 |
| Adhesive | Silicone rubber | $45 \times 10^{-6}$ | 0.1 |

SUMMARY OF THE INVENTION

The present invention was made in consideration of the above circumstances and it is an object of the invention to provide a method of producing a semiconductor device whereby the occurrence of tensile stresses to be caused in the solders due to the thermal expansion of a silicone gel layer is prevented, thereby improving reliability without exerting the influence due to thermal expansion to other component parts.

According to the invention, there is provided a method of producing a semiconductor device which comprises a protecting silicone gel layer which covers a semiconductor chip and bonding wires for taking out electrodes from said semiconductor chip, and a resin layer which has a smaller thermal expansion coefficient than that of said silicone gel layer at least part of which contacts said silicone gel layer, said method comprising the steps of, thermally curing said silicone gel layer to obtain a semimanufactured product, injecting said resin in said semimanufactured product in the state where said semimanufactured product is maintained at a temperature higher than an ordinary temperature, subjecting said semimanufactured product to heat processing which has been preset at a still higher temperature without reducing the temperature of said semimanufactured product to one below said holding temperature, and curing said resin layer.

DETAILED DESCRIPTION OF THE PREFERRED EMBODIMENTS

The present invention was made on the basis of the following consideration.

Figure 1:
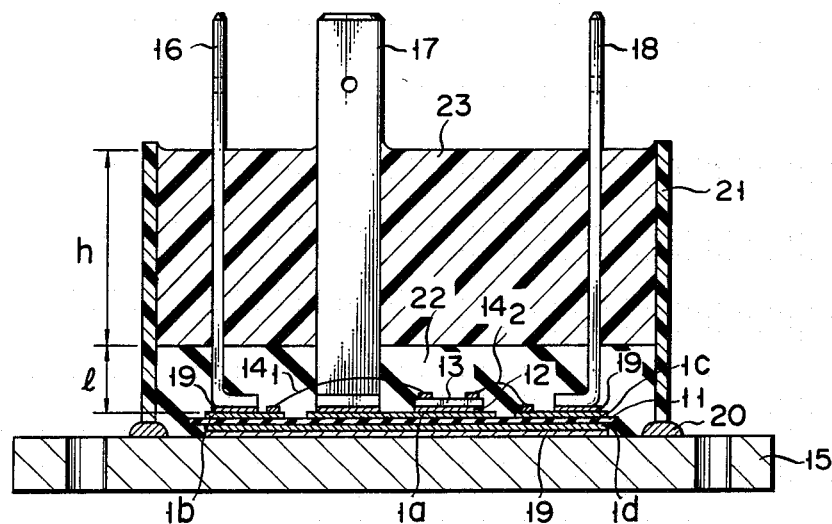
FIG. 1 is a diagram showing a cross-sectional constitution of a resin sealing type transistor.
Figure 2:
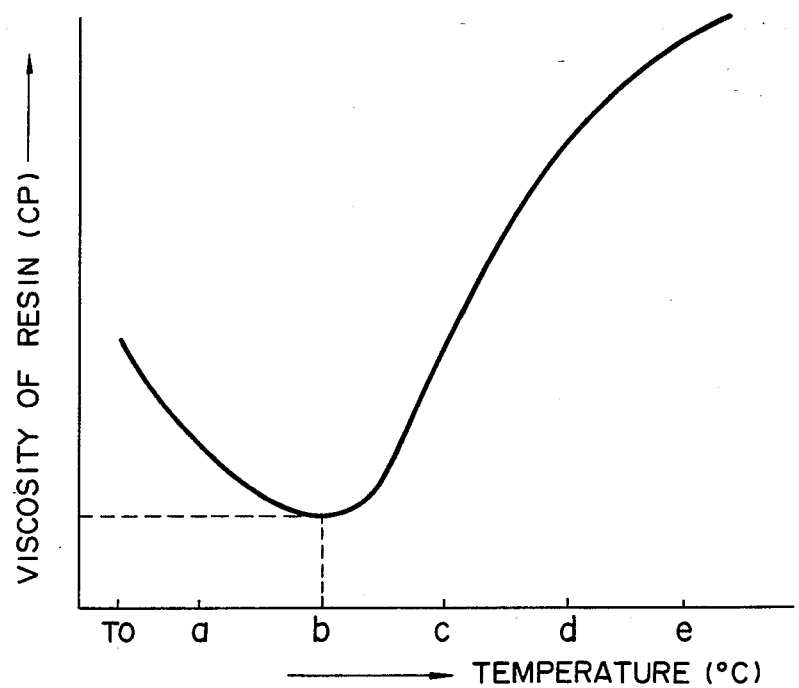
FIG. 2 shows a characteristic curve diagram representing a change of the viscosity for the temperature of an epoxy resin.

Although it is very complicated, the semiconductor device shown in FIG. 1, assuming that the difference between the thermal expansion elongation amount of the silicone gel layer 22 and the thermal expansion elongation amounts of the solders 19+terminals 16, 17 and 18 which are located in the silicone gel layer 22 approaches zero, namely, if $(C)' - (A)' = 0$, shows that it is fundamentally possible even at high temperatures to minimize the tensile stresses applied to the solders 19 for the terminals 16, 17 and 18.

The above relation $((C)' - (A)' = 0)$ may be obtained when the silicone gel layer 22 is kept at the maximum product guarantee temperature, e.g., 125° C.; the silicone gel layer 22 is thermally expanded to a volume that will be derived at that temperature; and it is solidified and packed by the sealing epoxy resin 23 in that state. In the case where a semiconductor device is formed in such a method, even if the product is cooled to an ordinary temperature, the space already formed inside the product when the silicone gel layer 22 expanded at 125° C. is ensured. On the other hand, even if the product is again heated to a temperature of 125° C., the silicone gel layer 22 will not expand over the above-mentioned space. Due to this, no tensile stress is applied to the solders 19, so that cracks and the separation of parts does not occur.

The present invention was made on the basis of such a consideration, and specifically relates to an improvement of steps (7) and (8) in the previously-mentioned conventional producing method. An embodiment of a producing method according to the present invention will now be described in detail with reference to FIG. 1.

(1) First, the semiconductor substrate structure 11 is formed, wherein the three independent copper plates 1a, 1b and 1c (serving as the collector, emitter, and base electrodes of the transistor respectively) are directly coupled on one surface of the above structure 11, and the copper plate 1d to which the other parts are soldered is directly coupled on the other surface, respectively.

(2) Next, the transistor chip 13 is mounted on the copper plate 1a serving as the collector electrode by the solder 12. On the other hand, the other two respective copper plates 1b and 1c, and the respective emitter and base electrodes of the transistor chip 13 are connected to bonding wires $14_1$ and $14_2$ each consisting of, for example, aluminum (Al).

(3) Then, in the above structure, the copper base 15 on which a solder paste having a lower melting point than that of the solder 12 was coated, and the terminals 16, 17 and 18 are set in a predetermined arrangement.

(4) Next, each of the above-mentioned components disposed in the predetermined positions is put into a reflow furnace which has been set at a low enough temperature that the solder 12 does not melt. In this way, the terminals 16, 17 and 18 and the copper plates 1a, 1b and 1c on one surface on the ceramic substrate 11 are respectively mutually adhered by the solder 19. Also, the copper plate 1d on the other surface on the ceramic substrate 11 and the copper base 15 are mutually adhered by the solder 19.

(5) Then, after the flux containing the solder paste is removed, the cylindrical casing 21 made of resin on the bottom of which the adhesive agent 20 was coated is mounted on the copper base 15, thereby adhering the casing to the copper base 15. This cylindrical resin casing 21 is disposed so as to surround the ceramic substrate 11 and the copper plates 1a to 1c attached to the upper portions and the terminals 16, 17 and 18.

(6) Subsequently, silicone gel from which foam has been almost completely removed is injected from the upper opening of the resin casing 21 into the casing 21 itself so as not to come into contact with the terminals 16, 17 and 18, thereby forming the silicone gel layer 22. A sufficient quantity of silicone gel is injected into the casing 21 so as to at least completely embed the bonding wires 14. After injection, the above-mentioned structure is put in an oven pre-set to about 150° C. for one hour or more in order to cure the silicone gel 22. Either a single-liquid or double-liquid layer may be used as the silicone gel layer 22.

(7) Then, the semimanufactured product is mounted on a heater which has been set to a temperature X higher than the ordinary temperature (for example, 120° to 130° C.). After the semimanufactured product reaches temperature X, sealing epoxy resin which has been preheated to about 70° to 80° C. is injected. Checking whether the semimanufactured product has reached temperature X may be done by, e.g., checking the temperature of the surface of the silicone gel layer 22. Subsequently, the semimanufactured product is put into an oven which has been pre-set at a higher temperature than temperature X, preferably 130±5° C.

(8) Thereafter, the semimanufactured product is put into an oven which has been preset to temperature Y (about 130° C.), for 8 hours or more for curing.

As described above, a semiconductor device such as shown in FIG. 1 is produced.

In addition to step (8) regarding the curing step of the epoxy resin layer 23, the cure temperature was changed to about 130° C. which is 20° C. lower than about 150° C. in the conventional step (8). This is because reducing the cure temperature by about 20° C. prevents tensile stresses from being applied to the solders 19 due to the thermal expansion of the silicone gel layer 22 during the curing process. Moreover, temperature X was set at 120° to 130° C. in step (7) to facilitate measuring the temperature of the silicone gel layer 22. To measure the temperature of the silicone gel layer 22 the semimanufactured product is mounted on a heater. Conducted heat from the copper base 15 of the semimanufactured product is measured, because it is necessary to keep the temperature below the melting point (180° C.) of the solder 19. In the case where a semimanufactured product is heated by an oven, rather than the above method, it is possible to set temperature X at a higher temperature (e.g., 150° C.). However in this case, it is difficult to maintain the product temperature as the semimanufactured product must be taken out of the oven to measure its temperature. This causes work efficiency to be reduced.

To check the effects of the present invention, samples were made by variously changing the above-mentioned temperatures X and Y, and temperature cycle tests were performed. The contents of the samples are shown in TABLE II.

TABLE II

| Sample No. | Temperature X (°C.) | Temperature Y (°C.) | Sample No. | Temperature X (°C.) | Temperature Y (°C.) |
|---|---|---|---|---|---|
| (Conventional example) | | | (Conventional example) | | |
| [I] | 25 | 150 | [I]' | 25 | 130 |
| [II] | 50 | 150 | [II]' | 50 | 130 |
| [III] | 75 | 150 | [III]' | 75 | 130 |
| [IV] | 100 | 150 | [IV]' | 100 | 130 |
| [V] | 125 | 150 | [V]' | 125 | 130 |

Figure 3:
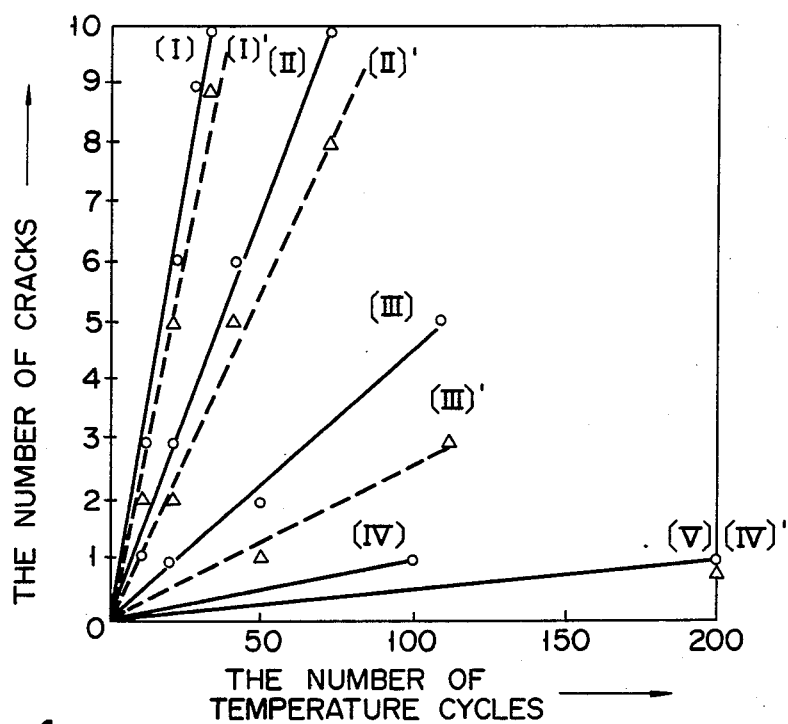
FIG. 3 shows a diagram indicating characteristic curves on the basis of the temperature cycle tests of some samples of the resin sealing type transistor.
Figure 4:
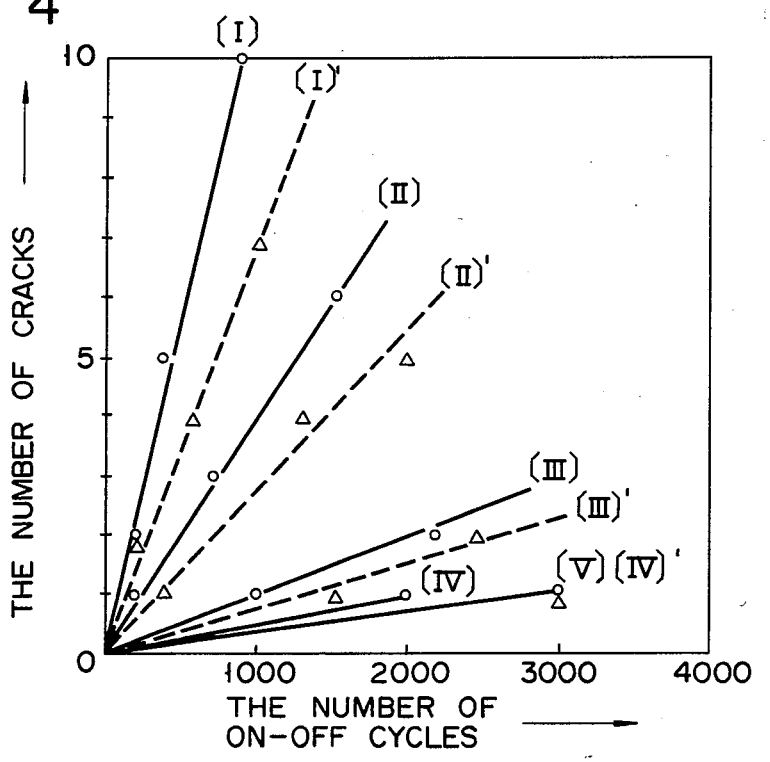
FIG. 4 shows a diagram representing characteristic curves on the basis of the on-off cycle tests of the same samples.
Figure 5:
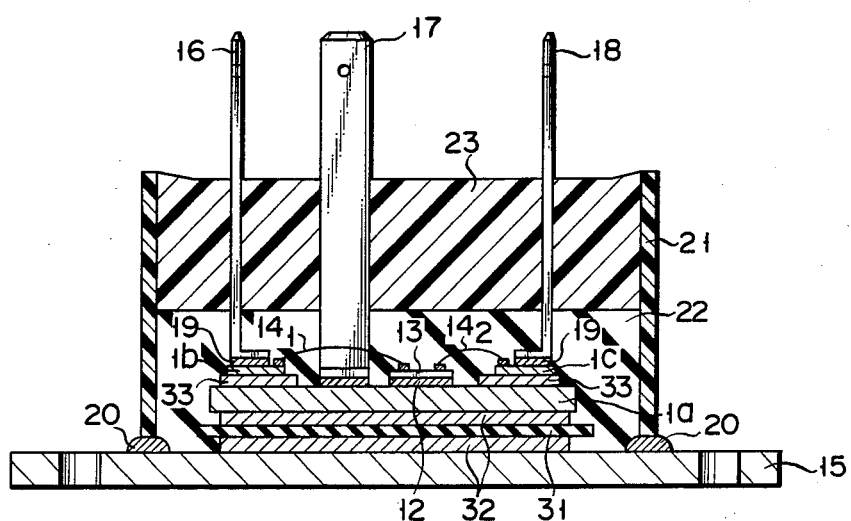
FIG. 5 is a diagram showing a cross-sectional constitution of another resin sealing type transistor.

The results of the temperature cycle tests (from −25° C. to +125° C.) are shown in FIG. 3. Also, the on-off cycle tests (where the exothermic temperature of the product casing was +125° C. to +25° C.) were performed together, so that the results were as shown in FIG. 4. As is obvious from the characteristic curves of FIGS. 3 and 4, the occurrence of cracks in the solders is largely affected by temperatures X and Y. In other words, with respect to temperature Y, the number of cracks that occurred when the temperature was set at 130° C. is smaller than that the number that occurred at 150° C. Reading temperature X, the number of cracks decreases as the temperature rises. It will be appreciated from this experimental data that in order to prevent the occurrence of cracks in the solders, it is necessary to thermally expand the silicone gel layer 22 by adding heat at temperatures over the product guarantee temperature and thereafter coating the sealing epoxy resin layer 23. In addition, similar data was also obtained with respect to the other samples in which the dimensions of each part, the injection quantity of the silicone gel, the quantity of the epoxy resin, the materials of the parts, etc. were changed. The data shown in FIGS. 3 and 4 was obtained where the present invention was applied to the semiconductor device as shown in FIG. 1. However, a similar effect can be derived even in the case when the present invention is applied to a semiconductor device having the structure such as shown in FIG. 5, instead of the device in which the ceramic substrate 11 and the copper plates 1a to 1d were directly coupled as shown in FIG. 1. In the resin sealing type transistor illustrated in FIG. 5, a part in which a ceramic substrate whose both side surfaces were metallized, and a copper plate are silver-alloy brazed is used. In FIG. 5, reference numeral 31 denotes a ceramic substrate whose side surfaces were metallized; 32 indicates a solder; and 33 is a ceramic plate. The other parts and components similar to those shown in FIG. 1 are designated by the same reference numerals although their descriptions are omitted.

According to the present invention, as apparent from the above description, a method of producing a semiconductor device with high reliability is provided whereby the occurrence of stresses due to thermal expansion of the silicone gel is prevented, thereby preventing cracking in the solders and peeling of the adhesive.

In addition, the present invention is not limited to the above embodiments, but it can be applied to all of the resin sealing type devices which use a silicone gel. For example, in the case of using an internal material having a large thermal expansion coefficient, the present invention can be also applied to the production of a semiconductor device in which it is desirable to prevent peeling between the resin and stem which is caused by thermal expansion.

That is, the present invention is not limited to the above embodiments. Various changes and modifications which are obvious to a person skilled in the art to which the invention pertains are deemed to lie within the spirit and scope of the invention.

What is claimed is:

1. A method of producing a resin-sealed semiconductor device including a semiconductor chip, electrodes connected to said semiconductor chip, and terminals mounted on said electrodes and projecting up from said electrodes, said method comprising the steps of:
   covering said semiconductor chip and said electrodes with a layer of silicone gel without contacting said terminals with said silicone gel;
   heating said silicone gel layer to a holding temperature to thermally expand said silicone gel layer;
   covering said silicone gel layer with a layer of resin having a coefficient of thermal expansion less than that of said silicone gel while maintaining said silicone gel thermally expanded at said holding temperature, said resin contacting said terminals projecting up from said silicone gel layer; and
   heating said resin to a curing temperature higher than said holding temperature to cure said resin.

2. The method according to claim 1, wherein said holding temperature is equal to or higher than the product guarantee temperature of said semiconductor device.

3. The method according to claim 1, wherein said curing temperature is about 130° C.

4. The method according to claim 1, further comprising the step of preheating said resin to a temperature of about 70°–80° C. before said resin covering step.

5. The method according to claim 1, wherein said electrodes are connected to said semiconductor chip by bonding wires and said silicone gel covering step includes covering said bonding wires with said silicone gel.

6. A method of sealing a semiconductor device having at least one projecting element bonded to and projecting up from said semiconductor device, comprising the steps of:

surrounding said semiconductor device with a casing;

filling a first portion of said casing with a heat-expandable and heat-curable gel, said gel covering said semiconductor device without contacting said projecting element, and said projecting element projecting up through said gel;

heating said gel to thermally expand and cure said gel in an expanded state;

filling a second portion of said casing with a heat-curable resin while maintaining said gel in said expanded state, said resin covering said gel and surrounding and contacting said projecting element, said projecting element projecting up through said resin; and heating said resin to a temperature sufficient to cure said resin while maintaining said gel in said expanded state.

7. The method according to claim 6, wherein said projecting element is bonded to said semiconductor device with a bonding agent flowable at a flow temperature, and said heating steps are carried out at temperatures less than said flow temperature.

8. The method according to claim 6, wherein said gel has a higher coefficient of thermal expansion than said resin.

* * * * *